US011876486B1

(12) United States Patent
Sahu et al.

(10) Patent No.: US 11,876,486 B1
(45) Date of Patent: Jan. 16, 2024

(54) LOW POWER CRYSTAL OSCILLATOR

(71) Applicant: NXP B.V., Eindhoven (NL)

(72) Inventors: Siyaram Sahu, Bari Raisen (IN);
Anand Kumar Sinha, Noida (IN);
Ateet Omer, Kanpur (IN); Krishna Thakur, GautamBudh Nagar (IN)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 18/154,968

(22) Filed: Jan. 16, 2023

(30) Foreign Application Priority Data

Nov. 29, 2022 (IN) ............................ 2022-21068753

(51) Int. Cl.
*H03B 5/36* (2006.01)
*H03B 5/06* (2006.01)

(52) U.S. Cl.
CPC .............. *H03B 5/06* (2013.01); *H03B 5/362* (2013.01); *H03B 5/366* (2013.01); *H03B 2200/0062* (2013.01); *H03B 2200/0082* (2013.01)

(58) Field of Classification Search
CPC ... H03B 5/30; H03B 5/32; H03B 5/36; H03B 5/362; H03B 5/364; H03B 5/366; H03B 5/368; H03B 2200/0062; H03B 2200/0082; H03L 5/00; H03L 5/02
See application file for complete search history.

(56) References Cited

U.S. PATENT DOCUMENTS

| | | | |
|---|---|---|---|
| 6,191,662 B1* | 2/2001 | Volk | H03K 3/3545 331/173 |
| 6,278,338 B1* | 8/2001 | Jansson | H03L 5/00 331/109 |
| 7,688,154 B1* | 3/2010 | Fotouhi | H03L 5/00 331/109 |
| 8,183,947 B2 | 5/2012 | Casagrande | |
| 8,643,445 B1 | 2/2014 | Samala | |
| 9,054,637 B1* | 6/2015 | Mittal | H03B 5/04 |
| 9,209,747 B1* | 12/2015 | Sinha | H03B 5/06 |
| 10,819,279 B1 | 10/2020 | Monsalve et al. | |
| 2003/0132741 A1* | 7/2003 | Senthilkumar | H03B 5/364 331/158 |
| 2004/0160285 A1* | 8/2004 | Lovelace | H03B 5/36 331/183 |
| 2006/0139104 A1* | 6/2006 | Stevenson | H03L 3/00 331/16 |
| 2009/0224844 A1* | 9/2009 | Orberk | H03B 5/366 331/183 |
| 2010/0259335 A1 | 10/2010 | Martin | |

(Continued)

*Primary Examiner* — Levi Gannon
(74) *Attorney, Agent, or Firm* — Robert J. Amedeo

(57) ABSTRACT

A low power crystal oscillator is provided. The crystal oscillator includes a gain stage circuit having a first gain stage input coupled at a first oscillator terminal and configured to receive a first oscillator signal of a crystal. A first bias circuit is configured to generate a first bias voltage based on the first oscillator signal. A reference circuit is configured to generate a reference current based on the first bias voltage. A comparator circuit is configured to generate a clock signal based on the first oscillator signal and the first bias voltage. The comparator circuit includes a second bias circuit configured to generate a second bias voltage. The gain stage circuit includes a second gain stage input coupled to receive the second bias voltage.

20 Claims, 5 Drawing Sheets

(56) References Cited

U.S. PATENT DOCUMENTS

2012/0326762 A1* 12/2012 Sakai .................... H03B 5/364
327/291
2013/0141171 A1* 6/2013 Huang ..................... H03L 7/00
331/8

* cited by examiner

LOW POWER CRYSTAL OSCILLATOR

CROSS-REFERENCE TO RELATED APPLICATIONS

This application claims the priority under 35 U.S.C. § 119 of India patent application no. 202221068753, filed on 29 Nov. 2022, the contents of which are incorporated by reference herein.

BACKGROUND

Field

This disclosure relates generally to electronic circuits, and more specifically, to a low power crystal oscillator.

Related Art

Today, a broad range of modern electronic devices incorporate crystal oscillators. Many of these electronic devices transmit or receive information or have other synchronous circuitry which utilizes a clock signal derived from a crystal oscillator. In many battery-powered applications, it is important for crystal oscillators to consume as little energy as possible in order to achieve a long battery life. It is therefore desirable to provide a crystal oscillator that accommodates a broad range of applications while providing long battery life.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Generally, there is provided, a low power crystal oscillator circuit configured to operate at a kilohertz range of frequencies. A compact circuit architecture includes a gain stage amplifier and a comparator circuit efficiently integrated to reduce area and power consumption. A bias generation circuit is configured to provide a bias voltage for the gain stage amplifier as well as a bias voltage for generation of a reference current. The comparator includes a second bias generation circuit configured to provide a second bias voltage based on the reference current. A gain control loop of the crystal oscillator circuit is formed as a feedback loop from a crystal input, through the bias circuit, to the reference current generation, through the comparator and second bias generation circuit, and back to the gain stage amplifier. A buffer circuit is coupled to the crystal oscillator circuit to provide a rail-to-rail buffered clock signal based on a non-rail-to-rail clock signal at the output of the comparator.

Figure 1:
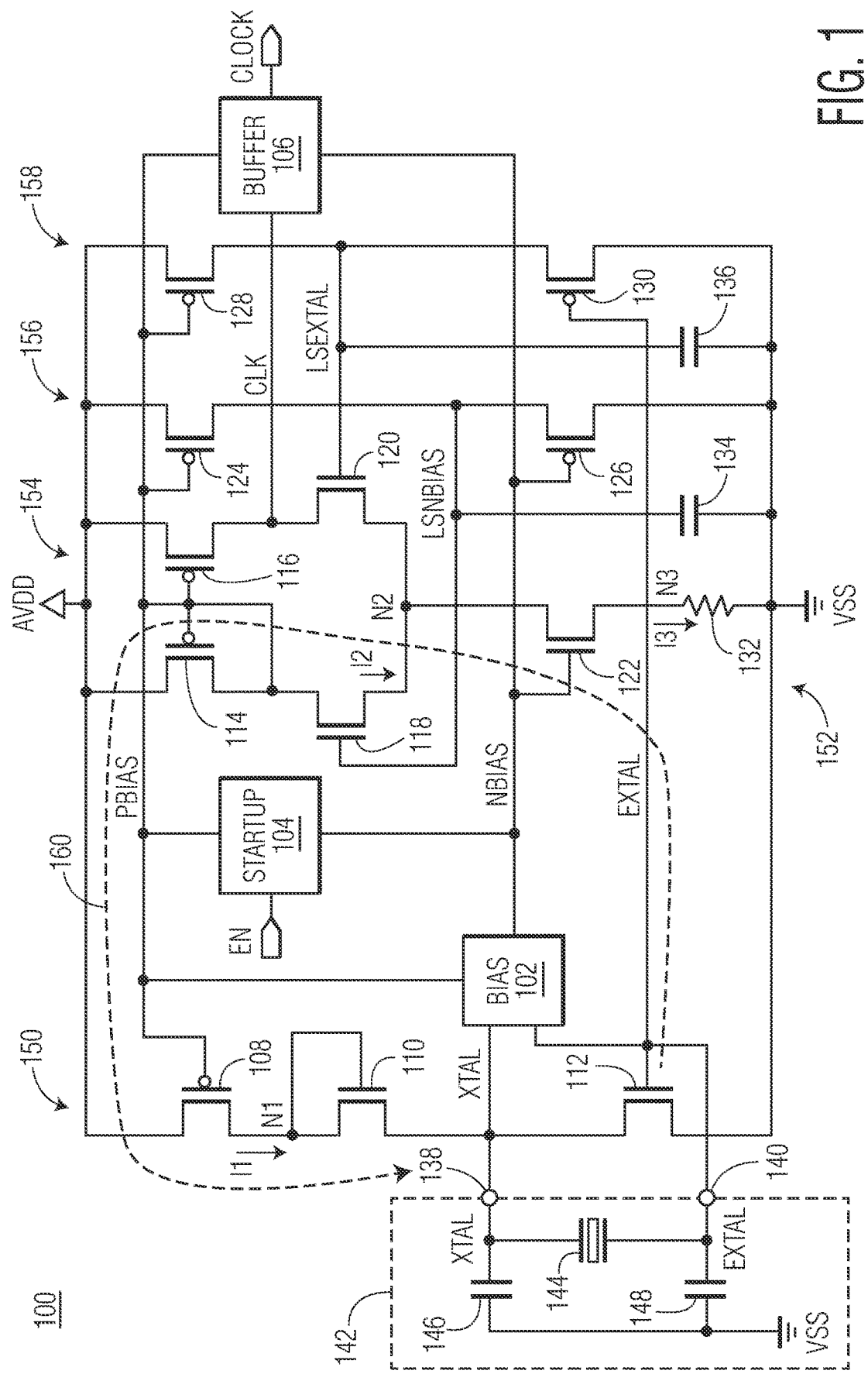
FIG. 1 illustrates, in simplified schematic diagram form, an example low power crystal oscillator in accordance with an embodiment.

FIG. 1 illustrates, in simplified schematic diagram form, an example low power crystal oscillator 100 in accordance with an embodiment. The oscillator 100 includes a gain stage circuit 150, a reference circuit 152, a comparator circuit 154, a bias circuit 102, a startup circuit 104, and a buffer circuit 106. In this embodiment, the gain stage circuit 150, reference circuit 152, comparator circuit 154, bias circuit 102, startup circuit 104, and buffer circuit 106 are formed on an integrated circuit (IC) and a crystal circuit 142 is formed separate from the IC and connected at oscillator terminals 138 and 140 labeled XTAL and EXTAL respectively. The bias circuit 102, startup circuit 104, and buffer circuit 106 depicted as circuit blocks in FIG. 1 are illustrated in further detail in FIG. 2 through FIG. 4.

In this embodiment, the gain stage circuit 150 (e.g., transconductance amplifier) of the crystal oscillator 100 includes P-channel transistor 108 and N-channel transistors 110 and 112 coupled in series between a first power supply terminal labeled AVDD and a second power supply terminal labeled VSS. In this embodiment, a normal operating analog voltage is supplied at the AVDD supply terminal and a ground (e.g., 0 volts) voltage is supplied at the VSS supply terminal. A first input of the gain stage circuit 150 is coupled at the node labeled EXTAL to receive a sinusoidal oscillator signal at the oscillator terminal 140 and a second input of the gain stage circuit 150 is coupled at the node labeled PBIAS to receive a bias voltage PBIAS.

The transistor 108 includes a first current electrode coupled at the AVDD supply terminal, a control electrode coupled at the PBIAS node, and a second current electrode coupled to a first current electrode and a control electrode of the transistor 110 at a node labeled N1. A second current electrode of the transistor 110 is coupled to a first current electrode of the transistor 112 at the XTAL node. The transistor 112 further includes a control electrode coupled at the EXTAL node and a second current electrode coupled at the VSS supply terminal. In this embodiment, the transistor 108 is configured as a current source to provide a current I1 based on the PBIAS voltage, and the transistor 110 is configured as a diode to adjust voltage at the XTAL node.

The reference circuit 152 of the crystal oscillator 100 includes an N-channel transistor 122 and a resistor 132 coupled in series between a node labeled N2 and the VSS power supply terminal in the embodiment depicted in FIG. 1. The transistor 122 includes a first current electrode coupled at the N2 node, a control electrode coupled at the NBIAS node, and a second current electrode coupled to a first terminal of the resistor 132 at a node labeled N3. A second terminal of the resistor 132 is coupled at the VSS power supply terminal. In this embodiment, the series coupled transistor 122 and resistor 132 together with the transistor 112 and the bias circuit 102 are configured to generate a reference current I3 through the reference circuit as a proportional to absolute temperature (PTAT) reference current.

The comparator circuit 154 of the crystal oscillator 100 includes P-channel transistors 114 and 116, N-channel transistors 118 and 120, and level shifters 156 and 158 in the embodiment depicted in FIG. 1. The transistor 114 includes a first current electrode coupled at the AVDD supply terminal and a control electrode and a second current electrode coupled at the PBIAS node. In this embodiment, the transistor is configured to generate the bias voltage PBIAS at the PBIAS node. The transistor 118 is coupled in series with the transistor 114 in a first branch of the comparator. The transistor 118 includes a first current electrode coupled to the second current electrode of the transistor 114 at the PBIAS node, a control electrode coupled at a node labeled LSNBIAS, and a second current electrode coupled at the N2 node.

The transistor 116 includes a first current electrode coupled at the AVDD supply terminal, a control electrode coupled at the PBIAS node, and a second current electrode coupled at a node labeled CLK. The transistor 120 is coupled in series with the transistor 116 in a second branch of the comparator. The transistor 120 includes a first current electrode coupled to the second current electrode of the transistor 116 at the CLK node, a control electrode coupled at a node labeled LSEXTAL, and a second current electrode coupled at the N2 node. In this embodiment, the comparator circuit 154 is configured to generate a clock signal CLK at the comparator output node CLK based on the EXTAL signal and the NBIAS voltage signal. For example, the comparator circuit is configured to generate the CLK signal by comparing level shifted versions of the EXTAL and NBIAS signals.

The level shifter 156 of the comparator circuit 154 includes P-channel transistors 124 and 126 and a capacitor 134. The transistor 124 includes a first current electrode coupled at the AVDD supply terminal, a control electrode coupled at the PBIAS node, and a second current electrode coupled at the LSNBIAS node. The transistor 126 is coupled in series with the transistor 124. The transistor 126 includes a first current electrode coupled to the second current electrode of the transistor 124 at the LSNBIAS node, a control electrode coupled at the NBIAS node, and a second current electrode coupled at the VSS supply terminal. The capacitor 134 includes a first terminal coupled at the LSNBIAS node and a second terminal coupled at the VSS supply terminal. In this embodiment, the level shifter 156 is configured to generate a level shifted signal LSNBIAS based on the N BIAS signal coupled at the control electrode of the transistor 126, for example.

The level shifter 158 of the comparator circuit 154 includes P-channel transistors 128 and 130 and a capacitor 136. The transistor 128 includes a first current electrode coupled at the AVDD supply terminal, a control electrode coupled at the PBIAS node, and a second current electrode coupled at the LSEXTAL node. The transistor 130 is coupled in series with the transistor 128. The transistor 130 includes a first current electrode coupled to the second current electrode of the transistor 128 at the LSEXTAL node, a control electrode coupled at the EXTAL node, and a second current electrode coupled at the VSS supply terminal. The capacitor 136 includes a first terminal coupled at the LSEXTAL node and a second terminal coupled at the VSS supply terminal. In this embodiment, the level shifter 158 is configured to generate a level shifted signal LSEX-TAL based on the EXTAL signal coupled at the control electrode of the transistor 130, for example.

The crystal circuit 142 is located "off-chip" and separate from the IC including the gain stage circuit 150, reference circuit 152, comparator circuit 154, bias circuit 102, startup circuit 104, and buffer circuit 106. The crystal circuit 142 is coupled at oscillator terminals 138 (XTAL) and 140 (EXTAL) of the crystal oscillator 100. The crystal circuit 142 in this embodiment includes crystal 144 and capacitors 146 and 148. A first terminal of the crystal 144 is coupled to a first terminal of capacitor 146 at the oscillator terminal 138 (XTAL) and a second terminal of crystal 144 is coupled to a first terminal of capacitor 148 at the oscillator terminal 140 (EXTAL). Second terminals of the capacitors 146 and 148 are coupled at the VSS supply terminal. In this embodiment, the crystal 144 is chosen to include properties conducive for operation at 32.768 kilohertz (KHz). In other embodiments, the crystal 144 may be chosen to include properties conducive for operation at other frequencies in the KHz and MHz ranges.

In this embodiment, the bias circuit 102 is configured to generate the NBIAS voltage based on EXTAL input signal and the XTAL feedback signal. The NBIAS voltage signal is provided at the control electrode of the transistor 122 establishing the PTAT reference current I3. The comparator circuit 154 is configured to divide the reference current I3 equally in the first and second branches of the comparator such that substantially half of the reference current I3 flows in each branch. The comparator circuit 154 is further configured to generate the PBIAS voltage at the PBIAS node by way of the transistor 114 configuration and the I2 current (e.g., half of the reference current I3) in the first branch. In turn, the PBIAS voltage signal is provided at the control electrode of the gain stage current source transistor 108 configured to generate a gain control current I1. In this embodiment, a gain control loop 160 of the crystal oscillator 100 is formed as a feedback loop from the EXTAL input, through the N BIAS bias voltage generation (e.g., bias circuit 120), to the reference current I3 generation (e.g., reference circuit 152), through the comparator circuit branch and generation of the PBIAS voltage (e.g., comparator circuit 154), and back to the current source transistor 108 for the I1 gain control current (e.g., gain stage circuit 150).

Figure 2:
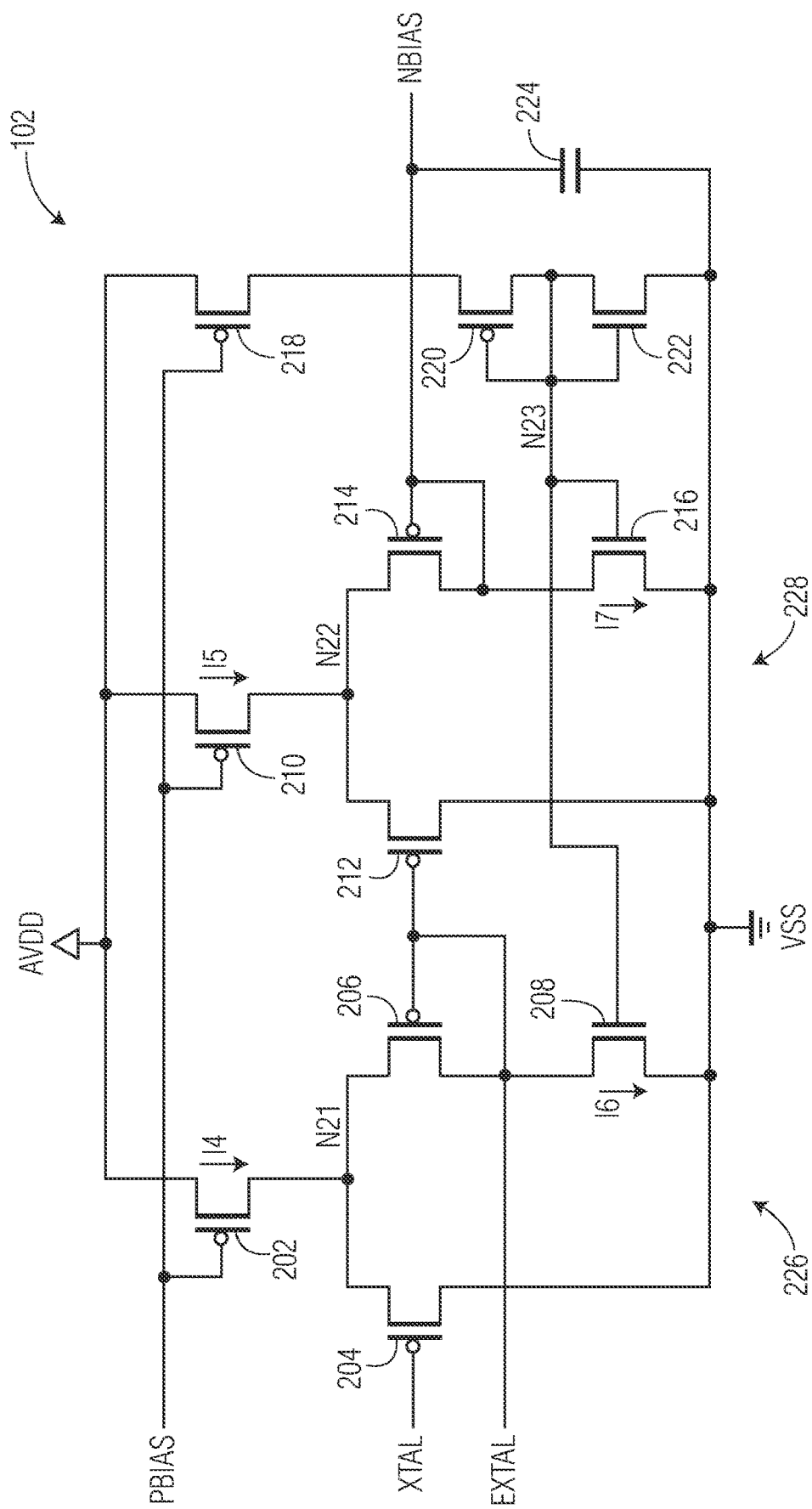
FIG. 2 illustrates, in simplified schematic diagram form, an example bias circuit in accordance with an embodiment.

FIG. 2 illustrates, in simplified schematic diagram form, an example implementation of the bias circuit 102 of the crystal oscillator 100 in accordance with an embodiment. The bias circuit 102 has a first input coupled at the XTAL node, a second input coupled at the EXTAL node, a third input coupled at the PBIAS node, and an output coupled at a node labeled NBIAS. The bias circuit 102 is configured to generate the bias voltage NBIAS at the NBIAS node based on the XTAL, EXTAL, and PBIAS voltage signals. The NBIAS voltage signal is provided at the NBIAS node coupled to transistors 122 and 126 and the startup circuit 104 and the buffer circuit 106, for example.

In this embodiment, the bias circuit 102 includes a first stage 226 and a second stage 228 coupled between the AVDD supply terminal and the VSS supply terminal. The first stage includes P-channel transistors 202, 204, and 206 and N-channel transistor 208. The transistor 202 includes a first current electrode coupled at the AVDD supply terminal, a control electrode coupled at the PBIAS node, and a second current electrode coupled at a node labeled N21. In this embodiment, the transistor 202 is configured as a first current source of the first stage to generate a first stage current I4. The transistor 204 includes a first current electrode coupled at the N21 node, a control electrode coupled at the XTAL node, and a second current electrode coupled at the VSS supply terminal. The transistor 206 includes a first current electrode coupled at the N21 node, and a control electrode and a second current electrode coupled at the EXTAL node. The transistor 208 includes a first current electrode coupled to the second current electrode of the transistor 206 at the EXTAL node, a control electrode coupled at a node labeled N23, and a second current electrode coupled at the VSS supply terminal. In this embodiment, the transistor 208 is configured as a second current source of the first stage to set a branch current I6 of the first stage current.

The second stage includes P-channel transistors 210, 212, and 214 and N-channel transistor 216. The transistor 210 includes a first current electrode coupled at the AVDD supply terminal, a control electrode coupled at the PBIAS node, and a second current electrode coupled at a node labeled N22. In this embodiment, the transistor 210 is configured as a first current source of the second stage to generate a second stage current I5. The transistor 212 includes a first current electrode coupled at the N22 node, a control electrode coupled at the EXTAL node, and a second current electrode coupled at the VSS supply terminal. The transistor 214 includes a first current electrode coupled at the N22 node, and a control electrode and a second current electrode coupled at the NBIAS node. The transistor 216 includes a first current electrode coupled to the second current electrode of the transistor 214 at the NBIAS node, a control electrode coupled at the N23 node, and a second current electrode coupled at the VSS supply terminal. In this embodiment, the transistor 216 is configured as a second current source of the second stage to set a branch current I7 of the second stage current.

The bias circuit 102 further includes a current source bias generation circuit including P-channel transistors 218 and 220 and N-channel transistor 222. The transistor 218 includes a first current electrode coupled at the AVDD supply terminal, a control electrode coupled at the PBIAS node, and a second current electrode. The transistor 220 includes a first current electrode coupled to the second current electrode of the transistor 218, and a control electrode and a second current electrode coupled at the N23 node. The transistor 222 includes a first current electrode and a control electrode coupled to the second current electrode of the transistor 220 at the N23 node, and a second current electrode coupled at the VSS supply terminal. In this embodiment, the transistors 218, 220, and 222 are configured to generate the current source bias voltage at the N23 node coupled at control electrodes of transistors 208 and 216. A first terminal of a capacitor 224 is coupled at the NBIAS node and a second terminal of the capacitor 224 is coupled at the VSS supply terminal.

In this embodiment, the first stage 226 provides a bias voltage to the control electrode of the transistor 112 of the gain stage circuit 150 and the second stage 228 generates the NBIAS voltage signal at the NBIAS node. The transistors 212 and 214 are biased to generate an EXTAL common mode voltage along with the capacitor 224. The EXTAL common mode voltage is generated as the NBIAS voltage provided to the transistor 122 of the reference circuit 152 of FIG. 1 to form a $\Delta Vgs/R$ PTAT configuration which generates the reference current I3. In this embodiment, first and second stage currents I4 and I5 are mirrored currents of the bias current I2 of FIG. 1. Branch currents I6 and I7 are each configured to be half (e.g., I4/2, I5/2) of the respective first and second stage currents I4 and I5.

Figure 3:
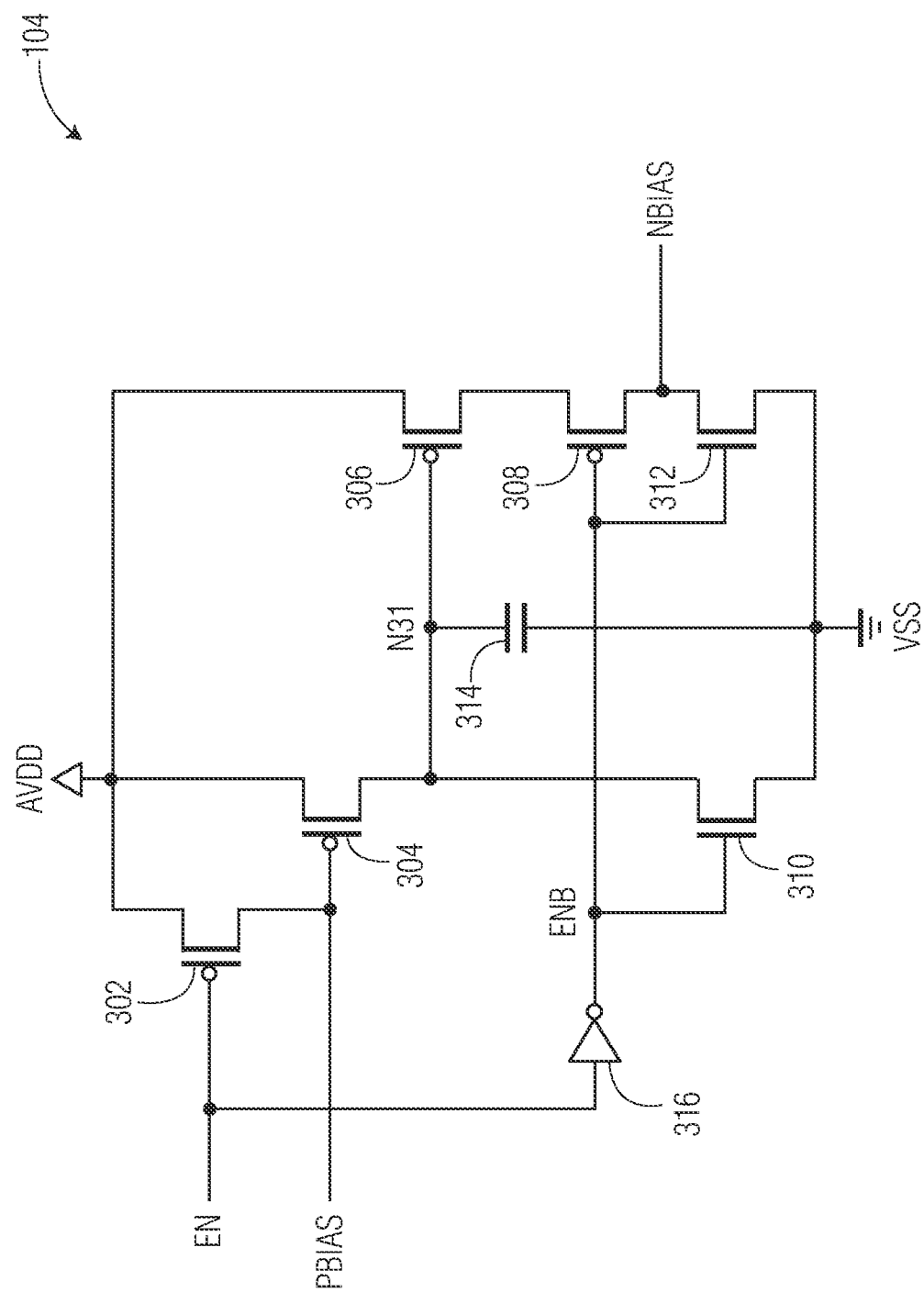
FIG. 3 illustrates, in simplified schematic diagram form, an example startup circuit in accordance with an embodiment.

FIG. 3 illustrates, in simplified schematic diagram form, an example implementation of the startup circuit 104 of the crystal oscillator 100 in accordance with an embodiment. The startup circuit 104 has a first input coupled to receive an enable control signal labeled EN, a second input coupled at the PBIAS node, and an output coupled at the NBIAS node. In this embodiment, the startup circuit is enabled when the EN signal is at a logic high level and disabled (e.g., powered down) when the EN signal is at a logic low level. The startup circuit 104 includes P-channel transistors 302-308, N-channel transistors 310 and 312, a capacitor 314, and an inverter 316 configured to generate a complementary control signal labeled ENB.

The transistor 302 includes a first current electrode coupled at the AVDD supply terminal, a control electrode coupled at a node labeled EN configured for receiving the EN control signal, and a second current electrode coupled at the PBIAS node. In this embodiment, the transistor 302 is configured as a first shunt transistor to pull up the PBIAS node to the AVDD voltage when the startup circuit is disabled. The transistor 304 includes a first current electrode coupled at the AVDD supply terminal, a control electrode coupled at the PBIAS node, and a second current electrode coupled at a node labeled N31. The transistor 306 includes a first current electrode coupled at the AVDD supply terminal, a control electrode coupled at the N31 node, and a second current electrode coupled at a first current electrode of the transistor 308. The transistor 308 further includes a control electrode coupled at a node labeled ENB configured for receiving the ENB control signal, and a second current electrode coupled at the NBIAS node. The transistor 310 includes a first current electrode coupled at the N31 node, a control electrode coupled at ENB node, and a second current electrode coupled at the VSS supply terminal. The transistor 312 includes a first current electrode coupled at the NBIAS node, a control electrode coupled at ENB node, and a second current electrode coupled at the VSS supply terminal. In this embodiment, the transistor 312 is configured as a second shunt transistor to pull down the N BIAS node to the VSS voltage when the startup circuit is disabled. The capacitor 314 has a first terminal coupled at the N31 node and a second terminal coupled at the VSS supply terminal.

In this embodiment, the startup circuit 104 is disabled when the EN signal is at a logic low voltage level. When at the logic low voltage level, the crystal oscillator 100 is configured such that NBIAS=VSS, PBIAS=AVDD, and the reference current I3=0 nA (FIG. 1). The startup circuit 104 is enabled when the EN signal transitions to a logic high voltage level. When the EN signal transitions to the logic high voltage level, the N BIAS node is coupled to the AVDD supply terminal by way of transistors 306 and 308 and thus, current generation starts in the reference circuit 152. Transistor 310 turns off (e.g., ENB at logic low voltage level) and the PBIAS node voltage is generated by the crystal oscillator circuit and the capacitor 314 charges by way of transistor 304. After the capacitor 314 charges to a sufficient voltage level, the transistor 306 turns off and isolates the AVDD supply terminal from the NBIAS node. In turn, the crystal oscillator 100 settles into a normal operating mode.

Figure 4:
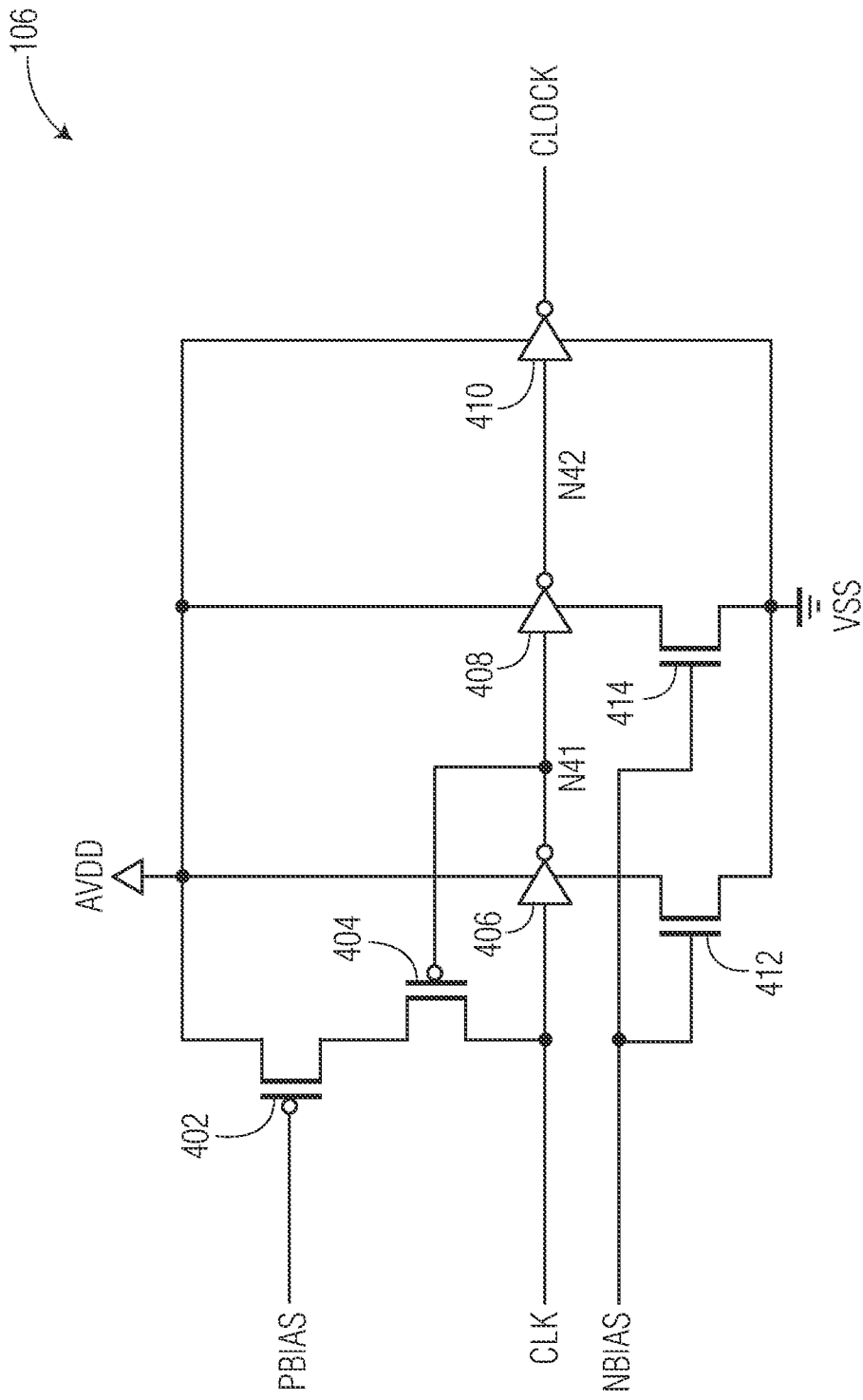
FIG. 4 illustrates, in simplified schematic diagram form, an example buffer circuit in accordance with an embodiment.

FIG. 4 illustrates, in simplified schematic diagram form, an example implementation of the buffer circuit 106 of the crystal oscillator 100 in accordance with an embodiment. The buffer circuit 106 has a first input coupled to receive the CLK signal output from comparator at the CLK node, a second input coupled at the PBIAS node, and a third input coupled at the NBIAS node. In this embodiment, the buffer circuit 106 is characterized as a low power Schmitt trigger buffer circuit. The buffer circuit 106 is configured to receive a non-rail-to-rail CLK signal and to generate a buffered square wave full rail-to-rail (e.g., AVDD to VSS) clock signal labeled CLOCK at the output node CLOCK of the buffer circuit 106. The buffer circuit 104 includes P-channel transistors 402 and 404, N-channel transistors 412 and 414, and inverter stages 406, 408, and 410.

The transistor 402 includes a first current electrode coupled at the AVDD supply terminal, a control electrode coupled at the PBIAS node, and a second current electrode coupled to a first current electrode of the transistor 404. The transistor 404 further includes a control electrode coupled at a node labeled N41 configured for providing feedback to create hysteresis, and a second current electrode coupled at the CLK node. The transistor 412 includes a first current electrode coupled at the VSS supply terminal, a control electrode coupled at the NBIAS node, and a second current electrode coupled as a ground voltage supply of the inverter stage 406. The transistor 414 includes a first current electrode coupled at the VSS supply terminal, a control electrode coupled at the NBIAS node, and a second current electrode coupled as a ground voltage supply of the inverter stage 408.

The first inverter stage 406 of the buffer circuit 106 includes an input coupled to receive the CLK signal at the CLK node and an output coupled at node N41. The inverter stage 406 further includes a power terminal coupled at the AVDD supply terminal and a ground terminal coupled at the second current electrode of the transistor 412. The second inverter stage 408 of the buffer circuit 106 includes an input coupled to receive the inverted CLK signal at node N41 and an output coupled at node N42. The inverter stage 406 further includes a power terminal coupled at the AVDD supply terminal and a ground terminal coupled at the second current electrode of the transistor 414. The third inverter stage 410 of the buffer circuit 106 includes an input coupled at node N42 and an output coupled at the CLOCK output node. The inverter stage 410 further includes a power terminal coupled at the AVDD supply terminal and a ground terminal coupled at the VSS supply terminal.

Figure 5:
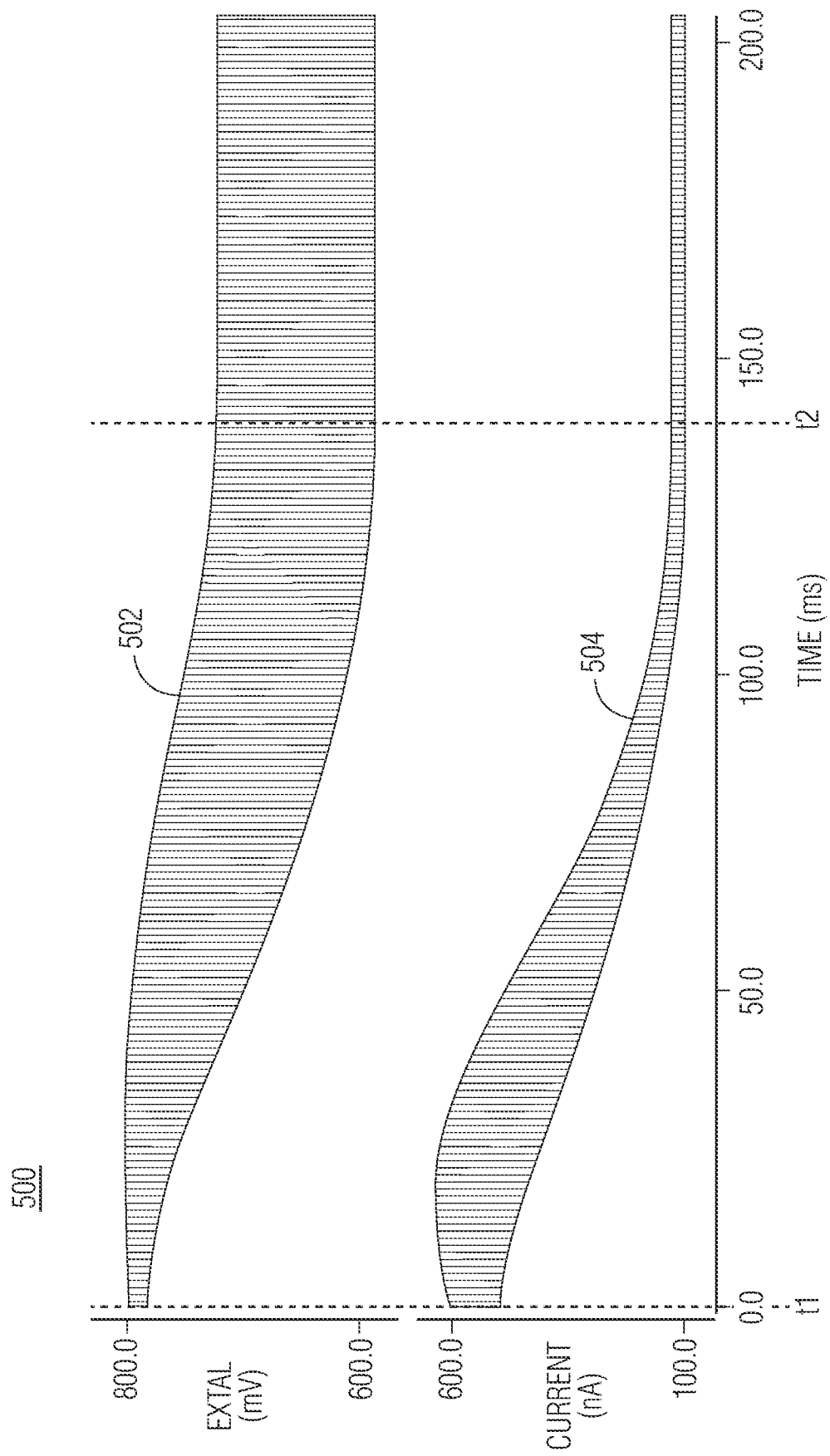
FIG. 5 illustrates, in plot diagram form, an example simulation result of the low power crystal oscillator startup in accordance with an embodiment.

FIG. 5 illustrates, in plot diagram form, an example start-up simulation result of the crystal oscillator 100 depicted in FIG. 1 in accordance with an embodiment. The plot diagram 500 includes an EXTAL voltage signal waveform 502 corresponding to a voltage signal at the EXTAL node, and CURRENT signal waveform 504 corresponding to the total current of the crystal oscillator 100. The EXTAL waveform is shown with voltage values in millivolts (mV) on the Y-axis and the CURRENT waveform is shown with current values in nanoamps (nA) on the Y-axis. The EXTAL and CURRENT waveforms are shown with time values in milliseconds (ms) on the X-axis. By way of example, start-up operation of the crystal oscillator 100 is depicted in the following.

At time t1, the oscillator circuit 100 is enabled and in a start-up phase of operation. When the oscillator circuit 100 is enabled, the EXTAL signal begins oscillating and the CURRENT signal reflects the activity of the oscillator circuit. As the amplitude of the EXTAL signal increase, its common mode voltage starts decreasing. Thus, the NBIAS voltage decreases causing the reference current to decrease. The reduction in the reference current results in a reduction in the gain stage amplifier current. At time t2, the oscillator circuit 100 reaches steady-state operation and the gain control loop 160 of the crystal oscillator 100 settles at a reduced steady-state current.

Generally, there is provided, a crystal oscillator circuit including a gain stage circuit coupled between a first voltage supply terminal and a second voltage supply terminal, the gain stage circuit having a first gain stage input coupled at a first oscillator terminal and configured to receive a first oscillator signal of a crystal; a first bias circuit having an input coupled at the first gain stage input and an output, the bias circuit configured to generate a first bias voltage based on the first oscillator signal; a reference circuit having an input coupled at the output of the first bias circuit, the reference circuit configured to generate a reference current based on the first bias voltage; and a comparator circuit coupled to the reference circuit at a first node, the comparator circuit configured to generate a clock signal at a comparator output based on the first oscillator signal and the first bias voltage, the comparator circuit including a second bias circuit configured to generate a second bias voltage, the gain stage circuit having a second gain stage input coupled to receive the second bias voltage. The comparator circuit may further include a first level shifter circuit coupled to receive the first oscillator signal and configured to generate a level-shifted version of the first oscillator signal; and a second level shifter circuit coupled to receive the first bias circuit voltage and configured to generate a level-shifted version of the first bias voltage; wherein the comparator circuit is configured to generate the clock signal by comparing the level-shifted versions of the first oscillator signal and the first bias voltage. The gain of the crystal oscillator circuit may be controlled by a loop formed by the gain stage circuit, bias circuit, reference circuit, and comparator circuit. The gain stage circuit may include a first transistor and a second transistor coupled in series between the first voltage supply terminal and the second voltage supply terminal, the first transistor having a control electrode configured as the first gain stage input and the second transistor having a control electrode configured as the second gain stage input. The first transistor may further include a first current electrode coupled at a second oscillator terminal and a second current electrode coupled at the second voltage supply terminal. The reference circuit may include a third transistor and a resistor coupled in series between the first node and the second voltage supply terminal, the first transistor together with the first bias circuit and the third transistor configured to generate the reference current as a proportional to absolute temperature (PTAT) reference current. The comparator circuit may further include a first transistor having a first current electrode coupled at the first voltage supply terminal and a second current electrode and control electrode coupled at a second node, the second node configured as a second bias voltage output of the second bias circuit; a second transistor having a first current electrode coupled at the second current electrode of the first transistor and the second node, a second current electrode coupled at the first node, and a control electrode configured as a first comparator input; a third transistor having a first current electrode coupled at the first voltage supply terminal, a second current electrode coupled at the comparator output, and control electrode coupled at the second node; and a fourth transistor having a first current electrode coupled at the comparator output, a second current electrode coupled at the first node, and a control electrode configured as a second comparator input. The circuit may further include a buffer circuit having an input coupled at comparator output, the buffer circuit configured to generate a full rail-to-rail clock signal based on the clock signal at the comparator output. The circuit may further include a startup circuit coupled between the first voltage supply terminal and the second voltage supply terminal, the startup circuit configured to couple a voltage at the first voltage supply terminal to the output of the first bias circuit.

In another embodiment, there is provided, a crystal oscillator circuit including a gain stage circuit including a first transistor and a second transistor coupled in series between a first voltage supply terminal and a second voltage supply terminal, the first transistor having a control electrode configured as a first gain stage input to receive a first oscillator signal of a crystal and the second transistor having a control electrode configured as a second gain stage input; a first bias circuit having an input coupled at the first gain stage input and an output, the bias circuit configured to generate a first bias voltage based on the first oscillator signal; a reference circuit having an input coupled at the output of the first bias circuit, the reference circuit configured to generate a reference current based on the first bias voltage; and a comparator circuit coupled to the reference circuit, the comparator circuit configured to generate a clock signal at a comparator output based on the first oscillator signal and the first bias voltage, the comparator circuit including a second bias circuit configured to generate a second bias voltage, the second gain stage input coupled to receive the second bias voltage. The comparator circuit may further include a first level shifter circuit coupled to receive the first oscillator signal and configured to generate a level-shifted version of the first oscillator signal; and a second level shifter circuit coupled to receive the first bias circuit voltage and configured to generate a level-shifted version of the first bias voltage; wherein the comparator circuit is configured to generate the clock signal by comparing the level-shifted versions of the first oscillator signal and the first bias voltage. The comparator circuit may further include a first transistor having a first current electrode coupled at the first voltage supply terminal and a second current electrode and control electrode coupled at a second node, the second node configured as a second bias voltage output of the second bias circuit; a second transistor having a first current electrode coupled at the second current electrode of the first transistor and the second node, a second current electrode coupled at the first node, and a control electrode configured as a first comparator input to receive the level-shifted version of the first bias voltage; a third transistor having a first current electrode coupled at the first voltage supply terminal, a second current electrode coupled at the comparator output, and control electrode coupled at the second node; and a fourth transistor having a first current electrode coupled at the comparator output, a second current electrode coupled at the first node, and a control electrode configured as a second comparator input to receive the level-shifted version of the first oscillator signal. The first transistor may further include a first current electrode coupled at a second oscillator terminal and a second current electrode coupled at the second voltage supply terminal. The reference circuit may include a third transistor and a resistor coupled in series between the first node and the second voltage supply terminal, the first transistor together with the first bias circuit and the third transistor configured to generate the reference current as a proportional to absolute temperature (PTAT) reference current. The gain of the crystal oscillator circuit may be controlled by a loop including the gain stage circuit, the bias circuit, the reference circuit, and the comparator circuit.

In yet another embodiment, there is provided, a crystal oscillator circuit including a gain stage circuit coupled between a first voltage supply terminal and a second voltage supply terminal, the gain stage circuit including a first transistor having control electrode coupled at a first oscillator terminal and a first current electrode coupled at a second oscillator terminal, the control electrode configured as a first gain stage input to receive a first oscillator signal of a crystal; a first bias circuit having an input coupled at the first gain stage input and an output, the bias circuit configured to generate a first bias voltage based on the first oscillator signal; a reference circuit having an input coupled at the output of the first bias circuit, the reference circuit configured to generate a reference current based on the first bias voltage; and a comparator circuit coupled to the reference circuit at a first node, the comparator circuit configured to generate a clock signal at a comparator output based on the first oscillator signal and the first bias voltage, the comparator circuit including a second bias circuit configured to generate a second bias voltage, the gain stage circuit having a second gain stage input coupled to receive the second bias voltage. The reference circuit may include a second transistor and a resistor coupled in series between the first node and the second voltage supply terminal, the first transistor together with the first bias circuit and the second transistor configured to generate the reference current as a proportional to absolute temperature (PTAT) reference current. The gain stage circuit may further include a second transistor coupled in series between the first voltage supply terminal and the first transistor, the second transistor having a first current electrode coupled to the first voltage supply terminal and a control electrode configured as the second gain stage input. The comparator circuit may further include a first level shifter circuit coupled to receive the first oscillator signal and configured to generate a level-shifted version of the first oscillator signal; and a second level shifter circuit coupled to receive the first bias circuit voltage and configured to generate a level-shifted version of the first bias voltage; wherein the comparator circuit is configured to generate the clock signal by comparing the level-shifted versions of the first oscillator signal and the first bias voltage. The gain of the crystal oscillator circuit may be controlled by a loop including the gain stage circuit, the bias circuit, the reference circuit, and the comparator circuit.

By now it should be appreciated that there has been provided, a low power crystal oscillator circuit configured to operate at a kilohertz range of frequencies. A compact circuit architecture includes a gain stage amplifier and a comparator circuit efficiently integrated to reduce area and power consumption. A bias generation circuit is configured to provide a bias voltage for the gain stage amplifier as well as a bias voltage for generation of a reference current. The comparator includes a second bias generation circuit configured to provide a second bias voltage based on the reference current. A gain control loop of the crystal oscillator circuit is formed as a feedback loop from a crystal input, through the bias circuit, to the reference current generation, through the comparator and second bias generation circuit, and back to the gain stage amplifier. A buffer circuit is coupled to the crystal oscillator circuit to provide a rail-to-rail buffered clock signal based on a non-rail-to-rail clock signal at the output of the comparator.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A crystal oscillator circuit comprising:
    a gain stage circuit coupled between a first voltage supply terminal and a second voltage supply terminal, the gain stage circuit having a first gain stage input coupled at a first oscillator terminal and configured to receive a first oscillator signal of a crystal;
    a first bias circuit having an input coupled at the first gain stage input and an output, the bias circuit configured to generate a first bias voltage based on the first oscillator signal;
    a reference circuit having an input coupled at the output of the first bias circuit, the reference circuit configured to generate a reference current based on the first bias voltage; and
    a comparator circuit coupled to the reference circuit at a first node, the comparator circuit configured to generate a clock signal at a comparator output based on the first oscillator signal and the first bias voltage, the comparator circuit including a second bias circuit configured to generate a second bias voltage, the gain stage circuit having a second gain stage input coupled to receive the second bias voltage.

2. The circuit of claim 1, wherein the comparator circuit further includes:
    a first level shifter circuit coupled to receive the first oscillator signal and configured to generate a level-shifted version of the first oscillator signal; and
    a second level shifter circuit coupled to receive the first bias circuit voltage and configured to generate a level-shifted version of the first bias voltage;
    wherein the comparator circuit is configured to generate the clock signal by comparing the level-shifted versions of the first oscillator signal and the first bias voltage.

3. The circuit of claim 1, wherein a gain of the crystal oscillator circuit is controlled by a loop formed by the gain stage circuit, bias circuit, reference circuit, and comparator circuit.

4. The circuit of claim 1, wherein the gain stage circuit includes a first transistor and a second transistor coupled in series between the first voltage supply terminal and the second voltage supply terminal, the first transistor having a control electrode configured as the first gain stage input and the second transistor having a control electrode configured as the second gain stage input.

5. The circuit of claim 4, wherein the first transistor further includes a first current electrode coupled at a second oscillator terminal and a second current electrode coupled at the second voltage supply terminal.

6. The circuit of claim 4, wherein the reference circuit includes a third transistor and a resistor coupled in series between the first node and the second voltage supply terminal, the first transistor together with the first bias circuit and the third transistor configured to generate the reference current as a proportional to absolute temperature (PTAT) reference current.

7. The circuit of claim 1, wherein the comparator circuit further includes:
    a first transistor having a first current electrode coupled at the first voltage supply terminal and a second current electrode and control electrode coupled at a second node, the second node configured as a second bias voltage output of the second bias circuit;
    a second transistor having a first current electrode coupled at the second current electrode of the first transistor and the second node, a second current electrode coupled at the first node, and a control electrode configured as a first comparator input;
    a third transistor having a first current electrode coupled at the first voltage supply terminal, a second current electrode coupled at the comparator output, and control electrode coupled at the second node; and
    a fourth transistor having a first current electrode coupled at the comparator output, a second current electrode coupled at the first node, and a control electrode configured as a second comparator input.

8. The circuit of claim 1, further comprising a buffer circuit having an input coupled at comparator output, the buffer circuit configured to generate a full rail-to-rail clock signal based on the clock signal at the comparator output.

9. The circuit of claim 1, further comprising a startup circuit coupled between the first voltage supply terminal and the second voltage supply terminal, the startup circuit configured to couple a voltage at the first voltage supply terminal to the output of the first bias circuit.

10. A crystal oscillator circuit comprising:
    a gain stage circuit including a first transistor and a second transistor coupled in series between a first voltage supply terminal and a second voltage supply terminal, the first transistor having a control electrode configured as a first gain stage input to receive a first oscillator signal of a crystal and the second transistor having a control electrode configured as a second gain stage input;
    a first bias circuit having an input coupled at the first gain stage input and an output, the bias circuit configured to generate a first bias voltage based on the first oscillator signal;
    a reference circuit having an input coupled at the output of the first bias circuit, the reference circuit configured to generate a reference current based on the first bias voltage; and
    a comparator circuit coupled to the reference circuit, the comparator circuit configured to generate a clock signal at a comparator output based on the first oscillator signal and the first bias voltage, the comparator circuit including a second bias circuit configured to generate a second bias voltage, the second gain stage input coupled to receive the second bias voltage.

11. The circuit of claim 10, wherein the comparator circuit further includes:
    a first level shifter circuit coupled to receive the first oscillator signal and configured to generate a level-shifted version of the first oscillator signal; and
    a second level shifter circuit coupled to receive the first bias circuit voltage and configured to generate a level-shifted version of the first bias voltage;
    wherein the comparator circuit is configured to generate the clock signal by comparing the level-shifted versions of the first oscillator signal and the first bias voltage.

12. The circuit of claim 11, wherein the comparator circuit further includes:
- a first transistor having a first current electrode coupled at the first voltage supply terminal and a second current electrode and control electrode coupled at a second node, the second node configured as a second bias voltage output of the second bias circuit;
- a second transistor having a first current electrode coupled at the second current electrode of the first transistor and the second node, a second current electrode coupled at the first node, and a control electrode configured as a first comparator input to receive the level-shifted version of the first bias voltage;
- a third transistor having a first current electrode coupled at the first voltage supply terminal, a second current electrode coupled at the comparator output, and control electrode coupled at the second node; and
- a fourth transistor having a first current electrode coupled at the comparator output, a second current electrode coupled at the first node, and a control electrode configured as a second comparator input to receive the level-shifted version of the first oscillator signal.

13. The circuit of claim 10, wherein the first transistor further includes a first current electrode coupled at a second oscillator terminal and a second current electrode coupled at the second voltage supply terminal.

14. The circuit of claim 10, wherein the reference circuit includes a third transistor and a resistor coupled in series between the first node and the second voltage supply terminal, the first transistor together with the first bias circuit and the third transistor configured to generate the reference current as a proportional to absolute temperature (PTAT) reference current.

15. The circuit of claim 10, wherein a gain of the crystal oscillator circuit is controlled by a loop including the gain stage circuit, the bias circuit, the reference circuit, and the comparator circuit.

16. A crystal oscillator circuit comprising:
- a gain stage circuit coupled between a first voltage supply terminal and a second voltage supply terminal, the gain stage circuit including a first transistor having control electrode coupled at a first oscillator terminal and a first current electrode coupled at a second oscillator terminal, the control electrode configured as a first gain stage input to receive a first oscillator signal of a crystal;
- a first bias circuit having an input coupled at the first gain stage input and an output, the bias circuit configured to generate a first bias voltage based on the first oscillator signal;
- a reference circuit having an input coupled at the output of the first bias circuit, the reference circuit configured to generate a reference current based on the first bias voltage; and
- a comparator circuit coupled to the reference circuit at a first node, the comparator circuit configured to generate a clock signal at a comparator output based on the first oscillator signal and the first bias voltage, the comparator circuit including a second bias circuit configured to generate a second bias voltage, the gain stage circuit having a second gain stage input coupled to receive the second bias voltage.

17. The circuit of claim 16, wherein the reference circuit includes a second transistor and a resistor coupled in series between the first node and the second voltage supply terminal, the first transistor together with the first bias circuit and the second transistor configured to generate the reference current as a proportional to absolute temperature (PTAT) reference current.

18. The circuit of claim 16, wherein the gain stage circuit further includes a second transistor coupled in series between the first voltage supply terminal and the first transistor, the second transistor having a first current electrode coupled to the first voltage supply terminal and a control electrode configured as the second gain stage input.

19. The circuit of claim 16, wherein the comparator circuit further includes:
- a first level shifter circuit coupled to receive the first oscillator signal and configured to generate a level-shifted version of the first oscillator signal; and
- a second level shifter circuit coupled to receive the first bias circuit voltage and configured to generate a level-shifted version of the first bias voltage;
- wherein the comparator circuit is configured to generate the clock signal by comparing the level-shifted versions of the first oscillator signal and the first bias voltage.

20. The circuit of claim 16, wherein a gain of the crystal oscillator circuit is controlled by a loop including the gain stage circuit, the bias circuit, the reference circuit, and the comparator circuit.

\* \* \* \* \*